United States Patent
Kim

(10) Patent No.: US 10,097,781 B2
(45) Date of Patent: Oct. 9, 2018

(54) ANALOG-TO-DIGITAL CONVERTER AND OPERATING METHOD THEREOF

(71) Applicant: SK hynix Inc., Gyeonggi-do (KR)

(72) Inventor: Tae-Gyu Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/430,875

(22) Filed: Feb. 13, 2017

(65) Prior Publication Data
US 2017/0339359 A1   Nov. 23, 2017

(30) Foreign Application Priority Data

May 23, 2016  (KR) ........................ 10-2016-0062827

(51) Int. Cl.
| | |
|---|---|
| *H04N 5/378* | (2011.01) |
| *H04N 5/357* | (2011.01) |
| *H03M 1/12* | (2006.01) |
| *H03M 1/56* | (2006.01) |

(52) U.S. Cl.
CPC ........... *H04N 5/378* (2013.01); *H04N 5/3575* (2013.01); *H03M 1/123* (2013.01); *H03M 1/1245* (2013.01); *H03M 1/56* (2013.01)

(58) Field of Classification Search
None
See application file for complete search history.

(56) References Cited

U.S. PATENT DOCUMENTS

| | | | | |
|---|---|---|---|---|
| 7,741,988 | B2* | 6/2010 | Hattori | H03M 1/129 341/156 |
| 9,204,143 | B2* | 12/2015 | Wang | H04N 17/04 |
| 9,313,435 | B2* | 4/2016 | Nitta | H03M 1/1023 |
| 2012/0033097 | A1* | 2/2012 | Lim | H04N 5/3765 348/222.1 |
| 2013/0063627 | A1* | 3/2013 | Hashimoto | H04N 5/378 348/241 |
| 2014/0042300 | A1* | 2/2014 | Hsu | H04N 5/378 250/208.1 |

FOREIGN PATENT DOCUMENTS

KR       101047296       7/2011

* cited by examiner

*Primary Examiner* — James Hannett
(74) *Attorney, Agent, or Firm* — IP & T Group LLP

(57) ABSTRACT

An analog-to-digital conversion method may include: generating an initial comparison signal by comparing a pixel signal of a comparison column to a pixel signal of an adjacent column; generating a control signal for selecting a ramp signal according to the generated initial comparison signal; and performing data conversion by comparing the ramp signal selected according to the generated control signal to a difference between adjacent first and second pixel signals.

16 Claims, 10 Drawing Sheets

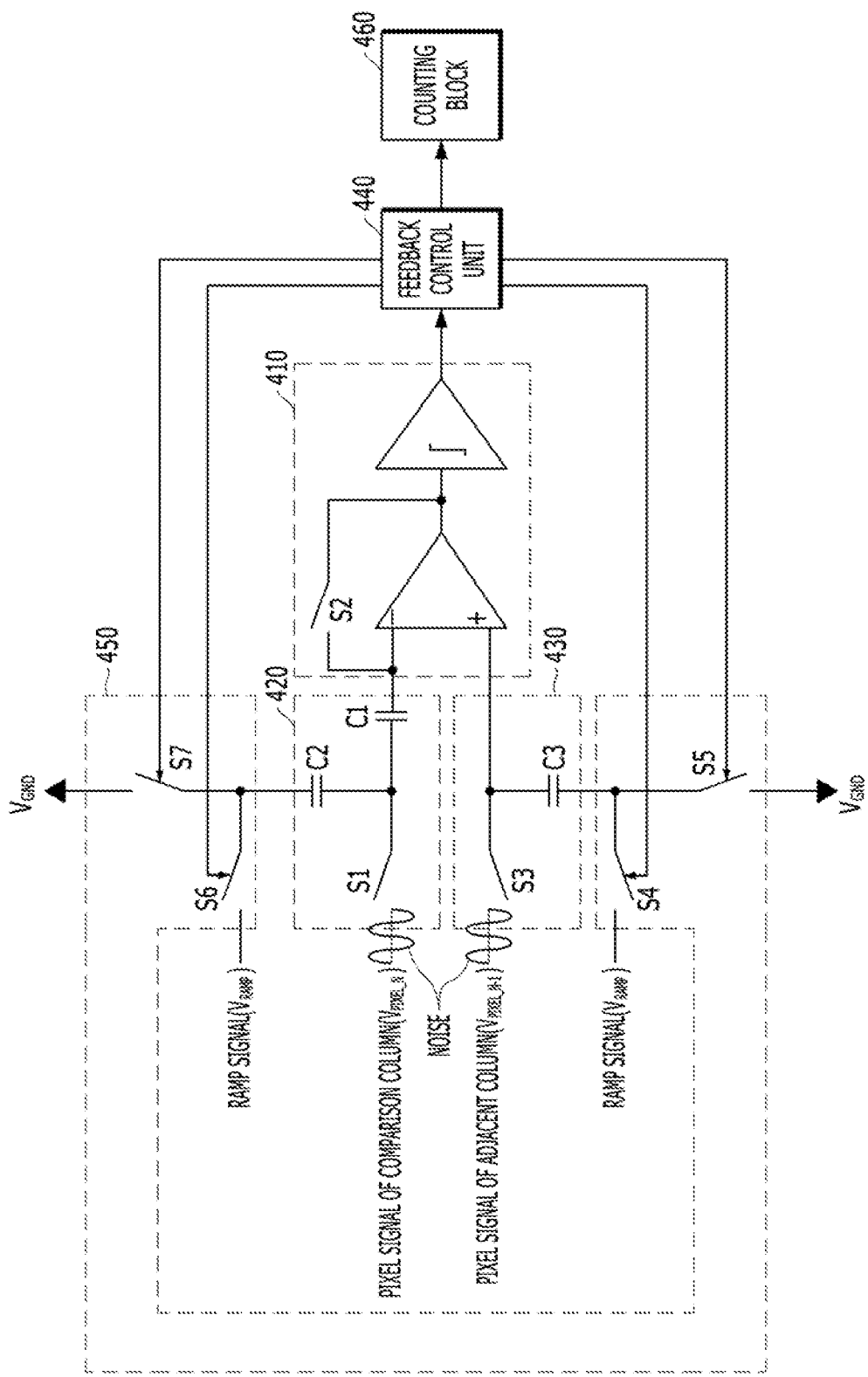

ANALOG-TO-DIGITAL CONVERTER AND OPERATING METHOD THEREOF

CROSS-REFERENCE TO RELATED APPLICATIONS

The present application claims priority of Korean Patent Application No. 10-2016-0062827, filed on May 23, 2016, which incorporated herein by reference in its entirety.

BACKGROUND

1. Field

Exemplary embodiments of the present invention relate to an image sensor, and more particularly, to an analog-to-digital converter used for image data conversion, and an operating method thereof.

2. Description of the Related Art

Image sensors capture images using photosensitive properties of semiconductors. Image sensors are generally classified into charge-coupled device (CCD) image sensors and complementary metal-oxide semiconductor (CMOS) image sensors. CMOS image sensors allow both analog and digital control circuits to be integrated in a single integrated circuit (IC), making CMOS image sensors the most widely used type of image sensor.

Generally, CMOS image sensors cost less and have smaller size compared to competitive products. As the image quality of CMOS image sensors is improving, their application field is widening to include video applications requiring both high resolution and high frame rate.

Typically, for removing an offset value of each pixel and measure a pixel signal that is more representative of the incident light, a CMOS image sensor compares pixel signals generated before and after an optical signal is incident thereon and measures the difference. Such an operation is known as a Correlated Double Sampling (CDS).

A CMOS image sensor counts a difference between a reset signal and an image signal which are sampled using CDS, and outputs the counted value as a digital signal. When converting each pixel signal through analog-to-digital conversion, the CMOS image sensor uses a ramp signal which sequentially falls from a high, to a low value or rises from a low to a high value. The CDS may remove a process variation in the pixel transistors (for example, threshold voltage variation) and a line resistance characteristic depending on the position of the pixels by transmitting a difference between the reset signal and the image signal. Therefore, the CDS exhibits a satisfactory noise characteristic.

In a high-resolution CMOS image sensor, however, as the size of a pixel (or unit pixel) is decreased while the size of a pixel array is increased, analog-to-digital converters of the respective columns are further closer to each other, the number of switching operations in a unit pixel is increased, and the amount of data to be processed is increased. Therefore, noise caused by counting and power noise caused by an increase in the consumed power may be increased, thereby causing a concern during a data conversion process.

Thus, there is a demand for a method which is capable of reducing noise, shortening a data conversion time, and lowering the number of counting operations, in order to implement a high-resolution and high-speed CMOS image sensor.

SUMMARY

Various embodiments are directed to an analog-to-digital converter and an operating method thereof capable of canceling noise caused when a pixel signal is extracted, while shortening a data conversion time, and reducing counting power consumption reducing the number of counting operations. The analog-to-digital converter and operating method thereof may process data at high speed. The analog-to-digital converter and operating method thereof may minimize standby power consumption. In an embodiment, an analog-to-digital converter comprising: a comparison block suitable for comparing a difference in value between adjacent first and second pixel signals with a ramp signal including a ramp-up signal and a ramp-down signal, the first pixel signal being a pixel signal of a comparison column and the second pixel signal being a pixel signal of an adjacent column to the comparison column; a correlated double sampling (CDS) block suitable for performing CDS the CDS block being coupled between a first input terminal receiving the first pixel signal and a negative input terminal of the comparison block; a sampling block suitable for performing sampling the sampling block being coupled between a second input terminal receiving the second pixel signal and a positive input terminal of the comparison block; a feedback control unit suitable for determining a ramping direction based on an initial comparison signal from the comparison block, and for outputting a control signal; a selection block coupled between the sampling block and a third input terminal receiving the ramp-up signal and a fourth input terminal receiving the ramp-down signal, and suitable for selecting the ramp-up signal or the ramp-down signal based on the control signal; and a data conversion unit suitable for performing data conversion according to a comparison signal of the comparison block to a digital code data.

The analog-to-digital converter may generate the initial comparison signal by comparing the first pixel signal and the second pixel signal, may determine the ramping direction based on the initial comparison signal to generate the control signal for selecting the ramp-up signal or ramp-down signal, and compares the ramp-up signal or the ramp-down signal selected according to the control signal to the difference value between the adjacent first and second pixel signals. When a value of the first pixel signal may be greater than a value of the second pixel signal, the feedback control unit sets the ramping direction to an upward direction and may generate the control signal to select the ramp-up signal, and when a value of the first pixel signal may be less than a value of the second pixel signal, the feedback control unit sets the ramping direction to a downward direction and may generate the control signal to select the ramp-down signal. The analog-to-digital converter may select the ramp-up signal according to the control signal to select the ramp-up signal and compares the selected ramp-up signal to the difference value between the adjacent first and second pixel signals, or may select the ramp-down signal according to the control signal to select the ramp-down signal and compares the selected ramp-down signal to the difference value between the adjacent first and second pixel signals.

In an embodiment, an analog-to-digital converter comprising: a comparison block suitable for comparing a pixel signal of a comparison column and a pixel signal of an adjacent column, and comparing a ramp signal applied through a CDS block or a ramp signal applied through a sampling block to a difference value between adjacent pixels; the CDS block coupled between a first input terminal receiving the first pixel signal and a negative input terminal of the comparison block, and suitable for performing CDS; the sampling block coupled between a second input terminal the second pixel signal and a positive input terminal of the comparison block, and suitable for performing sampling; a feedback control unit suitable for determining a ramp signal switching direction based on an initial comparison signal from the comparison block, and outputting a control signal; a selection block coupled between a third input terminal receiving a ramp signal and the CDS block and the sampling block, and suitable for selecting the ramp signal applied through the CDS block or the ramp signal applied through the sampling block based on the control signal from the feedback control unit; and a data conversion unit suitable for performing data conversion according to a comparison signal of the comparison block to a digital code data.

The analog-to-digital converter may generate the initial comparison signal by comparing the first pixel signal and the second pixel signal, determine the ramp signal switching direction based on the initial comparison signal to generate the control signal for selecting the ramp signal applied through the CDS block or the ramp signal applied through the sampling block, and compare the ramp signal applied through the CDS block or the ramp signal applied through the sampling block to the difference value between the adjacent first and second pixel signals, the ramp signal being selected according to the control signal. When a value of the first pixel signal may be greater than a value of the second pixel signal, the feedback control unit sets the ramp signal switching direction to the CDS block and may generate the control signal to select the ramp signal applied through the CDS block, and when a value of the first pixel signal may be less than a value of the second pixel signal, the feedback control unit sets the ramp signal switching direction to the sampling block, and may generate the control signal to select the ramp signal applied through the sampling block. The analog-to-digital converter may select the ramp signal applied through the CDS block according to the control signal to select the ramp signal applied through the CDS block and compares the selected ramp signal to the difference value between the adjacent first and second pixel signals, or may select the ramp signal applied through the sampling block according to the control signal to select the ramp signal applied through the sampling block and compares the selected ramp signal to the difference value between the adjacent first and second pixel signals.

In an embodiment, an analog-to-digital conversion method comprising: generating an initial comparison signal by comparing a pixel signal of a comparison column to a pixel signal of an adjacent column; generating a control signal for selecting a phase of a ramp signal with respect to the pixel signal based on the initial comparison signal; and comparing the selected ramp signal to a difference value between adjacent first and second pixel signals.

The generating of the control signal may comprise determining a ramping direction based on the initial comparison signal and generating a control signal for selecting a ramp-up signal or ramp-down signal. In the generating of the control signal, when a value of the first pixel signal may be greater than a value of the second pixel signal, the ramping direction may be set to an upward direction to generate the control signal to select the ramp-up signal, and when a value of the first pixel signal may be less than a value of the second pixel signals, the ramping direction may be set to a downward direction to generate the control signal to select the ramp-down signal. The generating of the control signal may comprise determining a ramp signal switching direction based on the initial comparison signal and generating the control signal for selecting the ramp signal switching direction through a CDS block or through a sampling block. In the generating of the control signal, when a value of the first pixel signal may be greater than a value of the second pixel signal, the ramp signal switching direction may be set to the CDS block to generate the control signal to select the ramp signal applied through the CDS block, and when a value of the first pixel signal may be less than a value of the second pixel signal, the ramp signal switching direction may be set to the sampling block to generate the control signal to select the ramp signal applied through the sampling block.

BRIEF DESCRIPTION OF THE DRAWINGS

FIG. 4A is a diagram illustrating an analog-to-digital converter in accordance with an embodiment of the present invention.

DETAILED DESCRIPTION

Figure 1A:
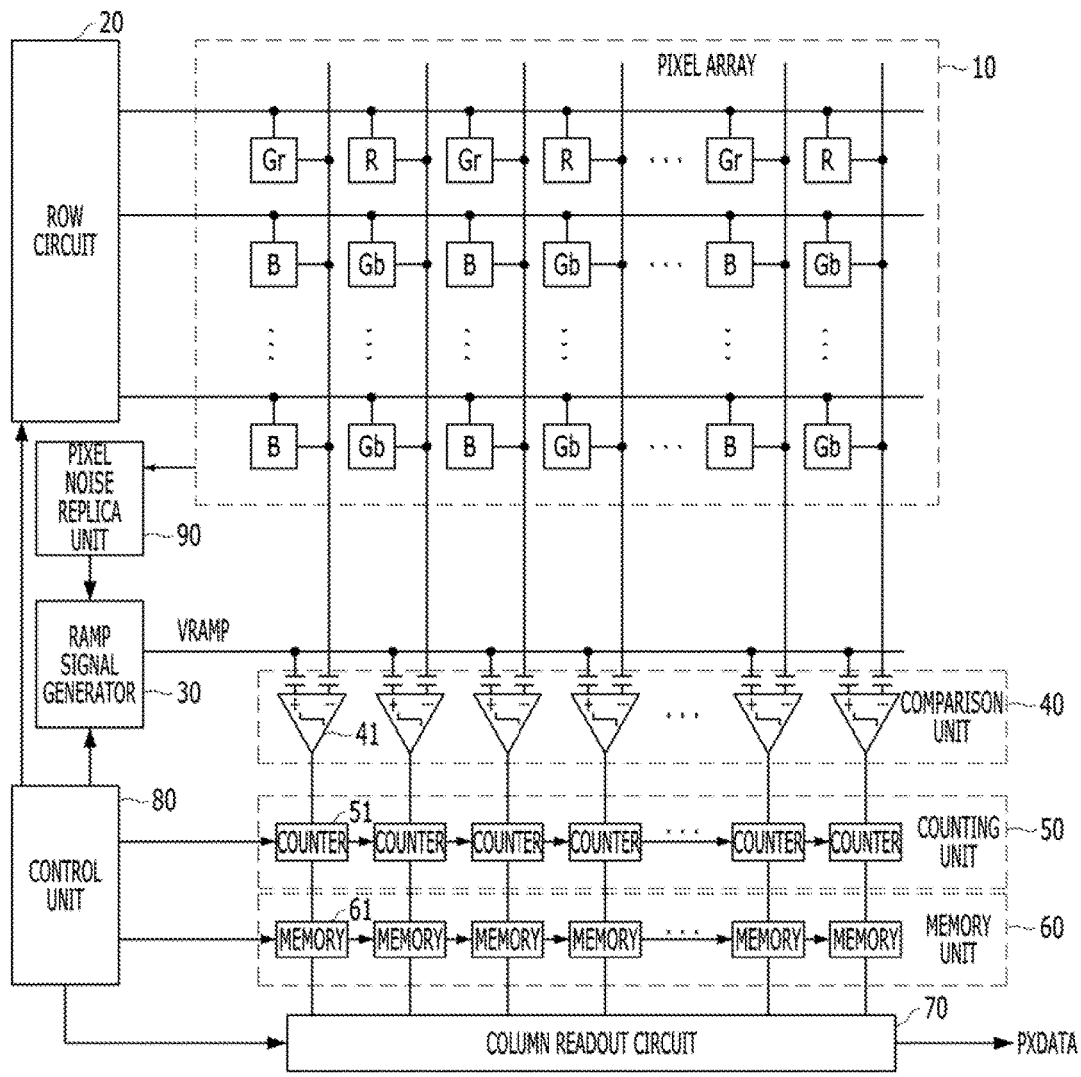
FIG. 1A is a diagram of a CMOS image sensor.

Various embodiments will be described below its more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Throughout the specification, when an element is referred to as being "coupled" to another element, it may not only indicate that the elements are "directly coupled" to each other, but also indicate that the elements are "electrically coupled" to each other with another element interposed therebetween.

The drawings are not necessarily to scale and, in some instances, proportions may have been exaggerated in order to more clearly illustrate the various elements of the embodiments. For example, in the drawings, the size of elements and the intervals between elements may be exaggerated compared to actual sizes and intervals for convenience of illustration.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

As used herein, singular forms are intended to include the plural forms as well, unless the context clearly indicates otherwise.

It will be further understood that the terms "comprises," "comprising," "includes," "including," when used in this specification, specify the presence of the stated elements and do not preclude the presence or addition of one or more other elements.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, an element (also referred to as a feature) described in connection with one embodiment may be used singly or in combination with other elements of another embodiment, unless specifically indicated otherwise.

FIG. 1A is a diagram of a CMOS image sensor. FIG. 1A shows a column parallel CMOS image sensor with a single slope analog-to-digital converter.

As illustrated in FIG. 1A, the CMOS image sensor includes a pixel array 10, a row circuit 20, a pixel noise replica unit 90, a ramp signal generator 30, a comparison unit 40, a counting unit 50, a memory unit 60, a control unit 80 and a column readout circuit 70.

The pixel array 10 may output a pixel signal corresponding to incident light. The row circuit 20 may select a pixel within the pixel array 10 at each row line, and control the operation of the selected pixel, under the control of the control unit 80. For example, the row circuit 20 may include a revs decoder and a row driver. The pixel noise replica unit 90 may replicate noise of a pixel within the pixel array 10. The ramp signal generator 30 may generate a ramp signal VRAMP to which the pixel noise from the pixel noise replica unit 90 is added (i.e., reflected), under the control of the control unit 80 and may transmit the combined ramp/noise signal to the comparison unit 40. The comparison unit 40 may compare a value of each pixel signal outputted from the pixel array 10 to a value of the ramp signal VRAMP to which the pixel noise is added. The counting unit 50 may count a clock applied from the control unit 80 according to each output signal of the comparison unit 40. The memory unit 60 may store the counting information provided from the counting unit 50 under the control of the control unit 80. The control unit 80 (for example, a timing generator) may control the operations of the row circuit 20, the ramp signal generator 30, the counting unit 50, the memory unit 60 and the column readout circuit 70. The column readout circuit 70 may sequentially output data of the memory unit 60 as pixel data PXDATA under the control of the control unit 80.

When the pixel noise replica unit 90 receives pixel noise from a pixel within the pixel array 10, and applies the received pixel noise to a voltage source of the ramp signal generator 30. The ramp signal generator 30 may generate a voltage or current in which the ramp signal and the pixel noise are added to generate the ramp signal VRAMP which accounts for the pixel noise, and apply the generated ramp signal VRAMP to the comparison unit 40.

The comparison unit 40 may include a plurality of comparators 41, the counting unit 50 may include a plurality of counters 51, and the memory unit 60 may include a plurality of memories 61. That is, a comparator, a counter and a memory may be disposed at each column.

Figure 1B:
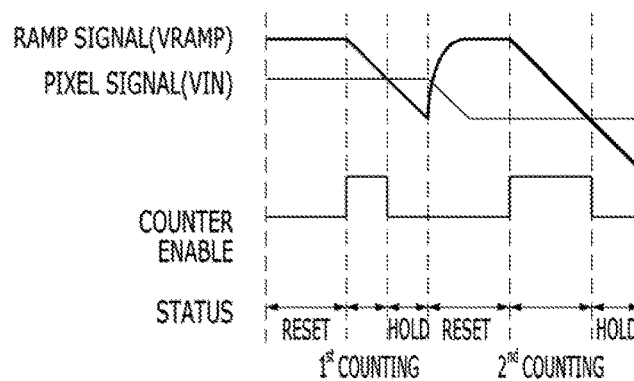
FIG. 1B is an analog-to-digital conversion timing diagram of the CMOS image sensor illustrated in FIG. 1A.

FIG. 1B is an analog-to-digital conversion timing diagram of the CMOS image sensor shown in FIG. 1A. Referring to FIGS. 1A and 1B, the operations of one comparator, one counter and one memory will be described as follows.

First the first comparator 41 may receive a pixel signal VIN outputted from a first column of the pixel array 10 through one terminal thereof, receive ramp signal VRAMP which includes the pixel noise through the other terminal thereof, and output a comparison signal by comparing the values of the two signals. The pixel noise included in the pixel signal VIN may be offset by the ramp signal VRAMP to which pixel noise is added.

Since the ramp signal VRAMP has a voltage level which ramps-down with a predetermined rate as time elapses after a reset operation, the values of two signals inputted to each comparator coincide with each other at a certain point in time. A logic level of the comparison signal outputted from each comparator may be inverted when the values of the two signals coincide with each other. The same process is performed by each one of the plurality of the comparators in the comparison circuit 40.

Thus, the first counter 51 may count the dock from when the ramp signal VRAMP starts to fall to when the comparison signal outputted from the comparator 41 is inverted, and output the counting information. Thus, the comparison signal may function as a counter enable signal. The same process is performed by each of the counters in the counting circuit 50. The counters may be initialized in response to a reset signal provided from the control unit 80.

Then, the first memory 61 may store the counting information applied from the counter 51 according to a load signal from the control unit 80, and output the stored counting information to the column readout circuit 70.

As illustrated in FIG. 1B, the CMOS image sensor may perform a first counting on the reset signal and perform a second counting on the image signal.

The above-described pixel noise cancellation method may effectively cancel pixel noise only when all pixel noises generated at the respective columns have the same phase and magnitude. However, since the pixel noises are randomly generated, the supposition that all pixel noises have the same phase and magnitude is different from the reality.

Thus, in the pixel noise cancellation method, phase-shifted pixel noise may worsen signal distortion between the pixel signal VIN and the ramp signal VRAMP to which pixel noise is reflected, depending on cases.

Meanwhile, the pixel noise cancellation method may cancel a part of pixel noises when the average of the pixel noises is reflected to the ramp signal VRAMP, but may not cancel actual pixel noises which are differently generated at the respective columns.

Figure 2A:
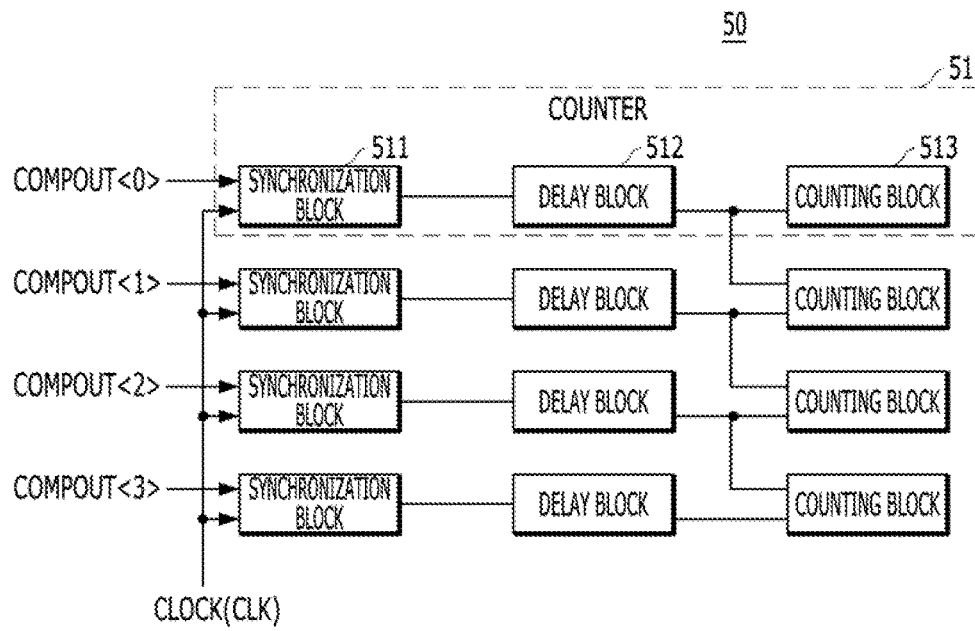
FIG. 2A is a detailed diagram of a counting unit shorn in FIG. 1A.

FIG. 2A is a detailed diagram of a counting unit 50.

Referring to FIG. 2A, the counter 51 of the counting unit 50, which is coupled to each column, may include a synchronization block 511, a delay block 512 and a counting block 513.

The synchronization block 511 may receive a clock CLK and data COMPOUT outputted from the comparator 41 of the corresponding column, and synchronize the data based on the clock. The synchronization block 511 may include a flip-flop.

The delay block 512 may delay an output signal of the synchronization block 511 by a predetermined number of clock cycles. For example, the delay block 512 may include one or more latches.

The counting block 513 may count an output signal of the delay block 512. One counting block (for example, the counting block 513) among the counting blocks of the counting unit 50 may count the output signal of the delay block 512, and each of the other counting blocks may count a difference value between an output signal of the corresponding delay block and an output signal of an adjacent (or previous) delay block.

Figure 2B:
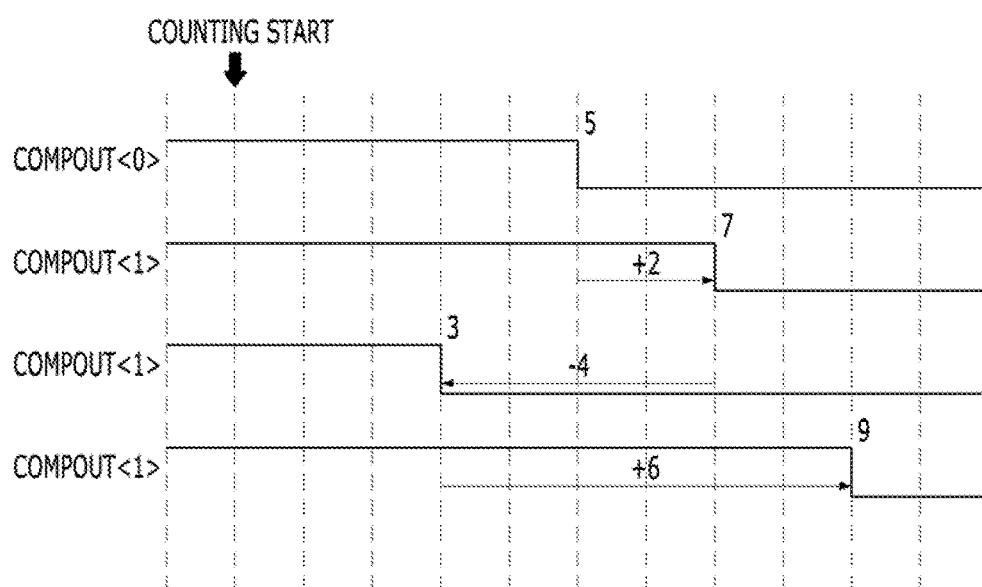
FIG. 2B is a diagram describing an operation of the counting unit shown in FIG. 2A.

FIG. 2B is a diagram for describing an operation of the counting unit 50 shown in FIG. 2A.

Referring to FIG. 2B, only the first to fourth columns will be taken as an example for description. For example, the data values of the first to fourth columns may be 5, 7, 3 and 9, respectively, when the counting is generally performed. In the CMOS image sensor shown in FIG. 1A, suppose that the data of the first column is read and a data difference between adjacent columns is read for each of the second to fourth columns. Then, data values counted by the counters from the first column to the fourth column may be 5, 2, −4 and 6 since a difference in data values between adjacent columns is read after one column is read.

When data COMPOUT<0> to COMPOUT<3> inputted to the respective counters of the first to fourth columns are counted, the data values may be 5, 7, 3 and 9, respectively, when the counting block counts the data as they are, but the counting block may count only data of one column, and count only a data difference between each of the other columns and the adjacent column using an XOR operation. The sign of the counted value may be set to plus (+) when the data of the corresponding column is greater than the data of the adjacent (or previous) column, or minus (−) when the data of the corresponding column is less than the data of the previous column.

For example, when the data of the first column is counted and an XOR operation on the first and second columns is performed for the second column, +2 may be obtained through COMPOUT<0> XOR COMPOUT<1>.

When an XOR operation on the second and third columns is performed for the third column, −4 may be obtained through COMPOUT<1> XOR COMPOUT<2>.

When an XOR operation on the third and fourth columns is performed for the fourth column, +6 may be obtained through COMPOUT<2> XOR COMPOUT<3>.

The above-described counting method using a data value difference may reduce counting power consumption by reducing the number of counting operations but the data conversion time may not be shortened. Thus, data may not be processed at high speed, and standby power consumption of the synchronization block may not be reduced. The reason that the data conversion time may not be shortened will be described in more detail. For example, suppose that the number of counting operations for a first pixel signal is 500 and the number of counting operations for a second pixel signal is 600, when a difference value between the two pixel signals is counted. In this case, a counting method in accordance with an embodiment of the present invention, which will be described below, may count only a difference value between two pixel signals, but the above-described counting method using a data value difference may perform only 100 counting operations after performing 500 counting operations. The counting block may not be operated before the two pixel signals from adjacent pixels are outputted, but perform the next counting operation after one pixel signal among two pixel signals from adjacent pixels is outputted. That is, the counting block starts the count operation including a first counting operation of the first pixel signal and a second counting operation of the second pixel signal after the first counting operation is complete and when the two pixel signals are outputted. Therefore, the above-described counting method may reduce power consumption only while no counting operations are performed, but the entire operation time may not be shortened.

Figure 3:
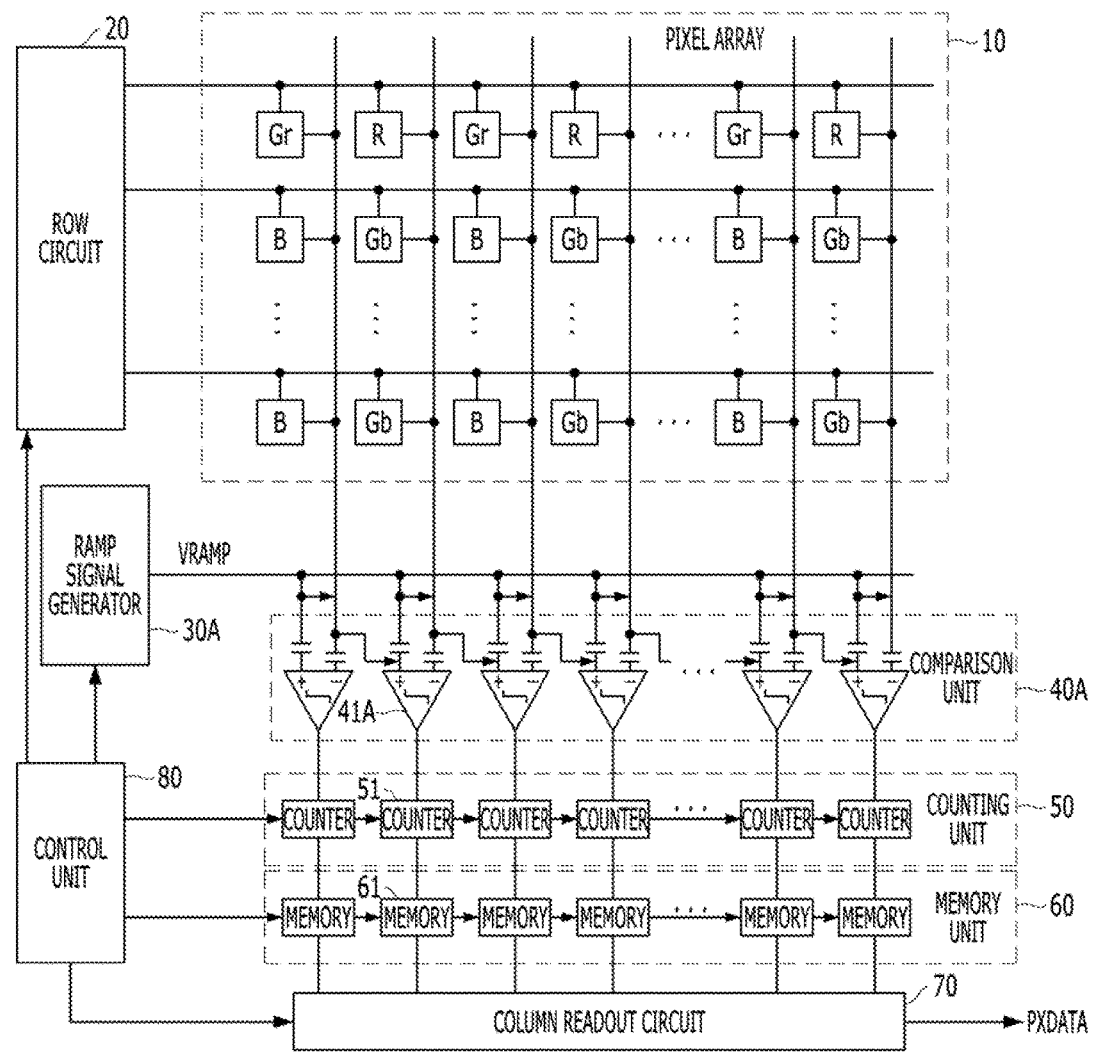
FIG. 3 is a diagram of a CMOS image sensor in accordance with an embodiment of the present invention.

FIG. 3 is a diagram of a CMOS image sensor in accordance with an embodiment the present invention.

As illustrated in FIG. 3, the CMOS image sensor may include a pixel array 10, a row circuit 20, a ramp signal generator 30, a comparison unit 40A, a counting unit 50, a memory unit 60, a control unit 80 and a column readout circuit 70.

The pixel array 10 may output a pixel signal $V_{PIXEL}$ corresponding to incident light. The row circuit 20 may select a pixel within the pixel array 10 at each row line, and control the operation of the selected pixel, under the control of the control unit 80. For example, the row circuit 20 may include a row decoder and a row driver. The ramp signal generator 30 may generate a ramp signal $V_{RAMP}$ under the control of the control unit 80. The comparison unit 40A may select a ramp signal applied through a CDS block (see FIG. 4A) from the ramp signal generator 30 or a ramp signal applied through a sampling block (see FIG. 4A) from the ramp signal generator 30, and compare the selected ramp signal to a difference value between adjacent pixel signals outputted from the pixel array 10. The counting unit 50 may count a clock applied from the control unit 80 according to each output signal of the comparison unit 40A. The memory unit 60 may store the counting information provided from the counting unit 50 under the control of the control unit 80. The control unit 80 (for example, a timing generator) may control the operations of the row circuit 20, the ramp signal generator 30, the counting unit 50, the memory unit 60 and the column readout circuit 70. The column readout circuit 70 may sequentially output the data of the memory unit 60 as pixel data PXDATA under the control of the control unit 80.

The comparison unit 40A may include a plurality of comparators, the counting unit 50 may include a plurality of counters, and the memory unit 60 may include a plurality of memories. That is, a comparator 41A, a counter 51 and a memory 61 may be disposed at each column.

Then, the operations of one comparator, one counter and one memory will be described as follows.

First, a comparator of a reference column may receive a pixel signal outputted from the corresponding column of the pixel array 10 through one terminal thereof, receive an initial ramp signal applied from the ramp signal generator 30 through the other terminal thereof, and output a reference comparison signal by comparing the values of the two signals. The initial ramp signal may be one of a ramp signal applied through a CDS block or a ramp signal applied through a sampling block. Since the comparator of the reference column is publicly known, the detailed descriptions thereof are omitted herein. The reference column may correspond to the first or last column, or both of the first and last columns.

Each of the comparators (e.g., 41A) positioned at the other columns except the reference column may receive a pixel signal outputted from the corresponding column of the pixel array 10 through one terminal thereof, receive a pixel signal outputted from the previous column of the pixel array 10 through the other terminal thereof, select any one of a ramp signal applied through a CDS block and a ramp signal applied through a sampling block according to a switch control signal and output a comparison signal by comparing a difference value between the two pixel signal s to the selected ramp signal. The corresponding column may be referred to as a comparison column which is to be compared.

Thus, the counter of the corresponding column may count the clock applied from the control unit 80 from when the ramp signal starts to fall (or rise) to when the comparison signal outputted from the comparator is inverted (i.e., a cross timing of the ramp signal and the ramp signal), and output the counting information. Thus, the comparison signal may function as a counter enable signal. The same process is performed by each of the counters in the counting circuit 50. Each of the counters may be initialized in response to a reset signal from the control unit 80.

Then, the memory 61 of the corresponding column may store the counting information applied from the counter 51 according to a load signal from the control unit 80, and output the stored counting information to the column read-out circuit 70.

Figure 4B:
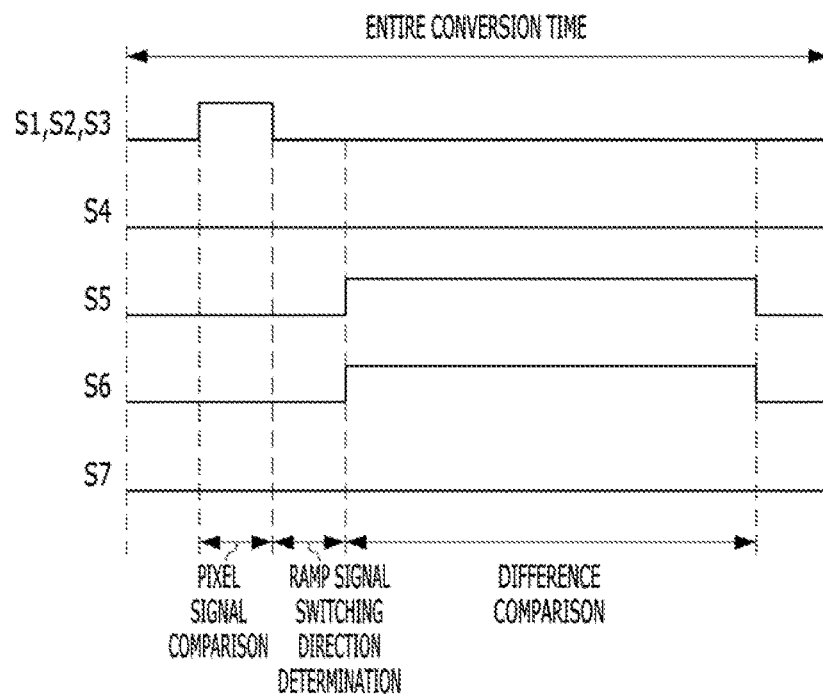
FIGS. 4B and 4C are diagrams describing control signal timings of the analog-to-digital converter shown in FIG. 4A.
Figure 4C:
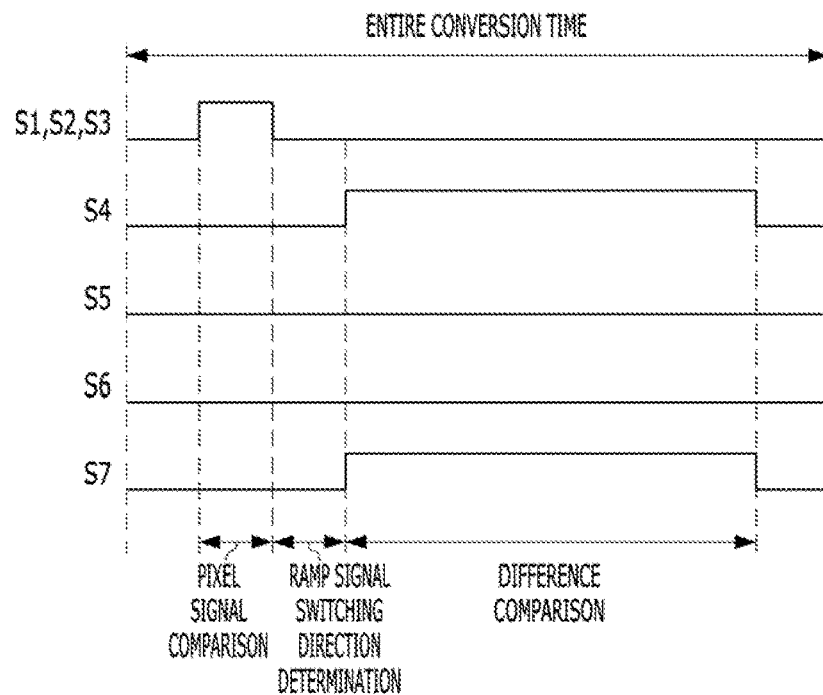
Figure 4D:
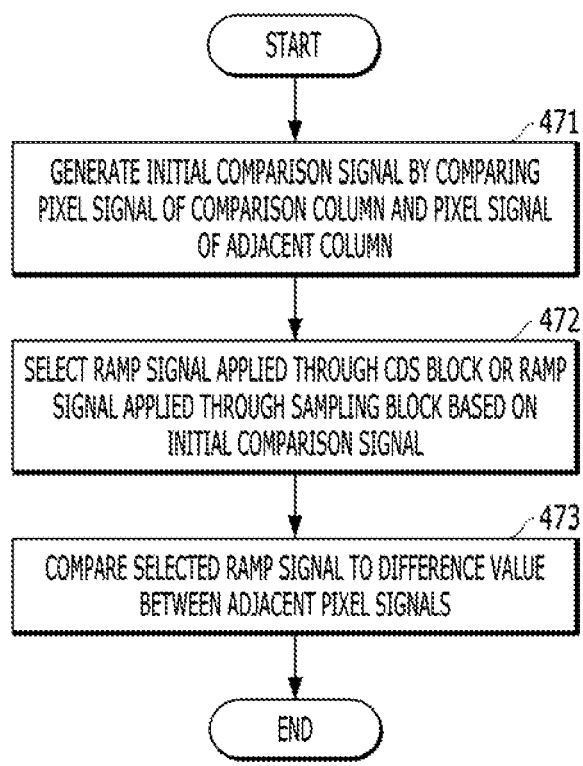
FIG. 4D is a flowchart of an operating method of the analog-to-digital converter shown in FIG. 4A.

FIG. 4A is a diagram illustrating an analog-to-digital converter in accordance with an embodiment of the present invention, FIGS. 4B and 4C are diagrams illustrating control signal timings of the analog-to-digital converter of FIG. 4A and FIG. 4D is a flowchart of an operating method of the analog-to-digital converter of FIG. 4A.

FIG. 4A illustrates a configuration of an analog-to-digital converter which is positioned at columns other than the reference column FIG. 4B shows control signal timings when a value of a pixel signal of a comparison column is greater than a value of a pixel signal of an adjacent column, and FIG. 4C shows control signal timings when a value of a pixel signal of a comparison column is less than a value of a pixel signal of an adjacent column.

As illustrated in FIG. 4A, the analog-to-digital converter in accordance with the present embodiment may include a comparison block 410, a CDS block 420, a sampling block 430, a feedback control unit 440, a selection block 450 and a data conversion unit 460. The comparison block 410 may compare a pixel signal $V_{PIXEL\_N}$ of a comparison column to a pixel signal $V_{PIXEL\_N-1}$ of an adjacent column at the initial stage, and compare any one signal selected between a ramp signal applied through the CDS block 420 and a ramp signal applied through the sampling block 430 to a difference value between adjacent pixel signals, that is, the pixel signal of the comparison column and the pixel signal of the adjacent column. The CDS block 420 may be coupled between a first input terminal receiving the pixel signal of the comparison column and a negative input terminal (−) of the comparison block 410, and perform CDS. The sampling block 430 may be coupled between a second input terminal receiving the pixel signal of the adjacent column and a positive input terminal (+) of the comparison block 410, and perform sampling. The feedback control unit 440 may determine a ramp signal switching direction according to the initial comparison signal from the comparison block 410, and output control signals, that is, fourth to seventh switch control signals for controlling fourth to seventh switches. The selection block 450 may be coupled between a third input terminal receiving a ramp signal and the CDS block 420 and the sampling block 430, and select a ramp signal applied through the CDS block 420 or a ramp signal applied through the sampling block according to the control signals from the feedback control unit 440. The data conversion unit 460 may perform data conversion according to a comparison signal of the comparison block 410.

The analog-to-digital converter may generate the initial comparison signal by comparing the pixel signal of the comparison column and the pixel signal of the adjacent column, determine the ramp signal switching direction according to the initial comparison signal, generate a control signal for selecting a ramp signal applied through the CDS block 420 or a ramp signal applied through the sampling block 430, compare the ramp signal applied through the CDS block 420 or the sampling block 430 to the difference value between the adjacent pixel signals, the ramp signal being selected according to the control signal, and perform a counting operation.

For example, the comparison block 410 may include an operational amplifier, a second switch S2 and a buffer or include the operational amplifier and the second switch S2. The CDS block 420 may include a first switch S1, a first capacitor C1 and a second capacitor C2 or include the first capacitor C1. The sampling block 430 may include a third switch S3 and a third capacitor C3. The selection block 450 may include the fourth to seventh switches S4 to S7.

The data conversion unit 460 may directly receive the comparison signal of the comparison block 410 or receive the comparison signal through the feedback control unit 440 as illustrated in FIG. 4A. The data conversion unit 460 may include a counter, and further include a memory. When data conversion is completed, the corresponding block may be disabled to reduce standby power.

Referring to FIGS. 4A to 4D, the operation of the analog-to-digital converter will be described as follows.

The entire operation process of the analog-to-digital converter may be performed in order of a pixel signal comparison, a ramp signal switching direction determination, a difference comparison. A counting operation may be performed while the difference comparison is performed.

First, the analog-to-digital converter may generate the initial comparison signal by comparing a pixel signal of a comparison column to a pixel signal of an adjacent column, at step 471. That is, the analog-to-digital converter may receive the pixel signal of the comparison column and the pixel signal of the adjacent column at the initial stage, and generate the initial comparison signal by comparing the two signals. More specifically, the first to third switches S1 to S3 may be turned on, and the fourth to seventh switches S4 to S7 may be turned off. As the first switch S1 is turned on, the value of the pixel signal of the comparison column, inputted through the first input terminal, may be stored in the second capacitor C2. As the second switch S2 is turned on, the value of the pixel signal of the adjacent column, inputted through the second input terminal, may be stored in the third capacitor C3. Then, the comparison block 410 may compare the voltage levels of the pixel signal of the comparison column and the pixel signal of the adjacent column, and output the initial comparison signal to the feedback control unit 440.

Then, the analog-to-digital converter may determine the ramp signal switching direction according to the initial comparison signal, and generate a control signal for selecting a ramp signal applied through the CDS block 420 or a ramp signal applied through the sampling block 430, at step 472. That is, when the comparison result between the pixel signal of the comparison column and the pixel signal of the adjacent column indicates that the pixel signal of the comparison column has a higher voltage level than the pixel signal of the adjacent column, the analog-to-digital converter may set the ramp signal switching direction to the CDS block 420, and generate a control signal for selecting the ramp signal applied through the CDS block 420. When the comparison result indicates that the pixel signal of the comparison column has a lower voltage level than the pixel signal of the adjacent column, the analog-to-digital converter may set the ramp signal switching direction to the sampling block 430 and generate a control signal for selecting the ramp signal applied through the sampling block 430. More specifically, the first to third switches S1 to S3 may be turned off. That is, when the comparison result between the pixel signal of the comparison column and the pixel signal of the adjacent column indicates that the pixel signal of the comparison column has a higher voltage level than the pixel signal of the adjacent column in a state where the first to seventh switches are turned off, the feedback control unit 440 may set the ramp signal switching direction to the CDS block 420, and generate control signals for selecting the ramp signal applied through the CDS block 420, that is, sixth and fifth switch control signals. When the comparison result indicates that the pixel signal of the comparison column has a lower voltage level than the pixel signal of the adjacent column, the feedback control unit 440 may set the ramp signal switching direction to the sampling block 430, and generate control signals (i.e., fourth and seventh switch control signals) for selecting the ramp signal applied through the sampling block 430.

Then, the analog-to-digital converter may compare the ramp signal applied from the CDS block 420 or the sampling block 430 to the difference value between the adjacent pixel signals, the ramp signal being selected according to the control signals, at step 473. That is, the analog-to-digital converter may select the ramp signal applied through the CDS block 420 according to the control signals (i.e., the sixth and fifth switch control signals) for controlling the ramp signal applied through the CDS block 420, and compare the ramp signal to the difference value between the adjacent pixel signals, or may select the ramp signal applied through the sampling block 430 according to the control signals (i.e., the fourth and seventh switch control signals) for controlling the ramp signal applied through the sampling block 430, and compare the ramp signal to the difference value between the adjacent pixel signals. More specifically, when the sixth and fifth switch control signals for selecting the ramp signal applied through the CDS block 420 are generated, the sixth switch S6 may be turned on to transfer the ramp signal to the CDS block 420 through the third input terminal. At this time, the fifth switch S5 may also be turned on. Then, the comparison block 410 may compare the difference value between the adjacent pixel signals to the ramp signal applied through the CDS block 420, and output a comparison signal. Thus, the data conversion unit 460 may perform data conversion in response to the comparison signal to a digital code data.

On the other hand, when the fourth and seventh switch control signals for selecting the ramp signal applied through the sampling block 430 are generated, the fourth switch S4 may be turned on to transfer the ramp signal to the sampling block 430 through the third input terminal. At this time, the seventh switch S7 may also be turned on. Then, the comparison block 410 may compare the difference value between the adjacent pixel signals to the ramp signal applied through the sampling block 430, and output a comparison signal. Thus, the data conversion unit 460 may perform data conversion in response to the comparison signal to a digital code data.

Figure 5:
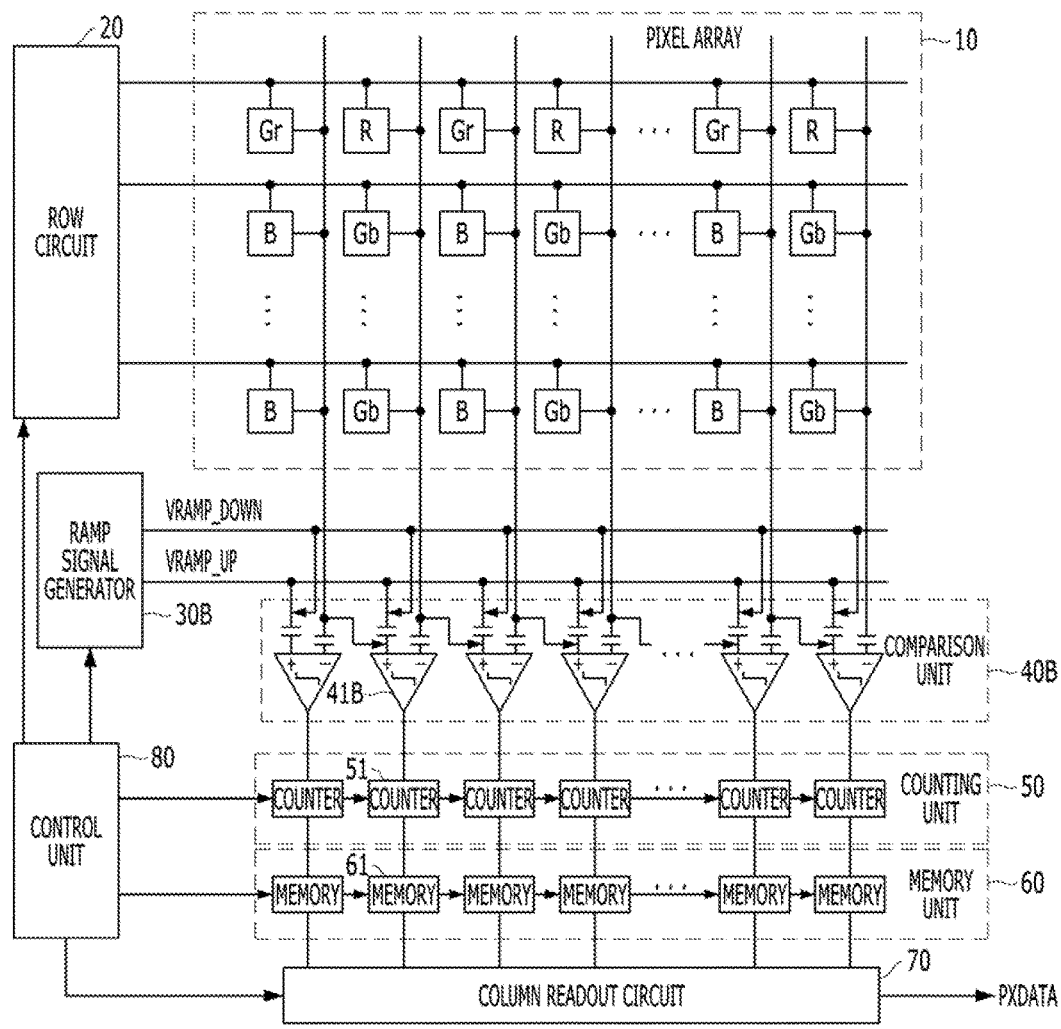
FIG. 5 is a diagram illustrating a CMOS image sensor in accordance with an embodiment of the present invention.

FIG. 5 is a diagram illustrating a CMOS image sensor in accordance with an embodiment of the present invention.

As illustrated in FIG. 5, the CMOS image sensor may include a pixel array 10, a row circuit 20, a ramp signal generator 30, a comparison unit 40B, a counting unit 50, a memory unit 60, a control unit 80 and a column readout circuit 70.

The pixel array 10 may output a pixel signal $V_{PIXEL}$ corresponding to incident light. The row circuit 20 may select a pixel within the pixel array 10 at each row line and control the operation of the selected pixel, under the control of the control unit 80. For example, the row circuit 20 may include a row decoder and a row driver. The ramp signal generator 30 may generate a ramp-up signal $V_{RAMP\text{-}UP}$ or a ramp-down signal $V_{RAMP\text{-}DOWN}$ under the control of the control unit 80. The comparison unit 40B may select the ramp-up or ramp-down signal applied from the ramp signal generator 30 and compare the selected ramp signal to a difference value between adjacent pixel signals outputted from the pixel array 10. The counting unit 50 may count a clock applied from the control unit 80 according to each output signal of the comparison unit 40B. The memory unit 60 may store the counting information provided from the counting unit 50 under the control of the control unit 80. The control unit 80 (for example, a timing generator) may control the operations of the row circuit 20, the ramp signal generator 30, the counting unit 50, the memory unit 60 and the column readout circuit 70. The column readout circuit 70 may sequentially output the data of the memory unit 60 as pixel data PXDATA under the control of the control unit 80.

The comparison unit 40B may include a plurality of comparators, the counting unit 50 may include a plurality of counters, and the memory unit 60 may include a plurality of memories. That is, a comparator 41B, a counter 51 and a memory 61 may be dispose at each column.

Hereafter, the operations of one comparator, one counter and one memory will be described as follows.

First, a comparator of a reference column may receive a pixel signal outputted from the corresponding column of the pixel array 10 through one terminal thereof, receive the initial ramp-up or ramp-down signal $V_{RAMP\text{-}UP}$ or $V_{RAMP\text{-}DOWN}$ applied from the ramp signal generator 30 through the other terminal thereof, and output a reference comparison signal by comparing the values of the two signals. Since the comparator of the reference column is publicly known, the detailed descriptions thereof are omitted herein. The reference column may correspond to the first or last column, or both of the first and last columns.

Each of the comparators (e.g., 41B) positioned at the other columns except the reference column may receive a pixel signal outputted from the corresponding column of the pixel array 10 through one terminal thereof, receive a pixel signal outputted from the previous adjacent column of the pixel array 10 through the other terminal thereof, select any one of the rising and ramp-down signals applied from the ramp signal generator 30 according to a switch control signal, and output a comparison signal by comparing the selected ramp signal to a difference value between the two pixel signals. The corresponding column may be referred to as a comparison column which is to be compared.

Thus, the counter of the corresponding column may count the clock applied from the control unit 80 from when the ramp-up signal $V_{RAMP\text{-}UP}$ starts to ramp-up (or the ramp-down signal $V_{RAMP\text{-}down}$ starts to ramp-down) to when the comparison signal outputted from the comparator is inverted (i.e., a cross timing of the ramp signal and the ramp signal), and output the counting information. Thus, the comparison signal may function as a counter enable signal. The same process is performed by each of the counters in the counting circuit 50. The counters may be initialized in response to a reset signal from the control unit 80.

Then, the memory 61 of the corresponding column may store the counting information provided from the counter 51 according to a load signal from the control unit 80, and output the stored counting information to the column readout circuit 70.

Figure 6A:
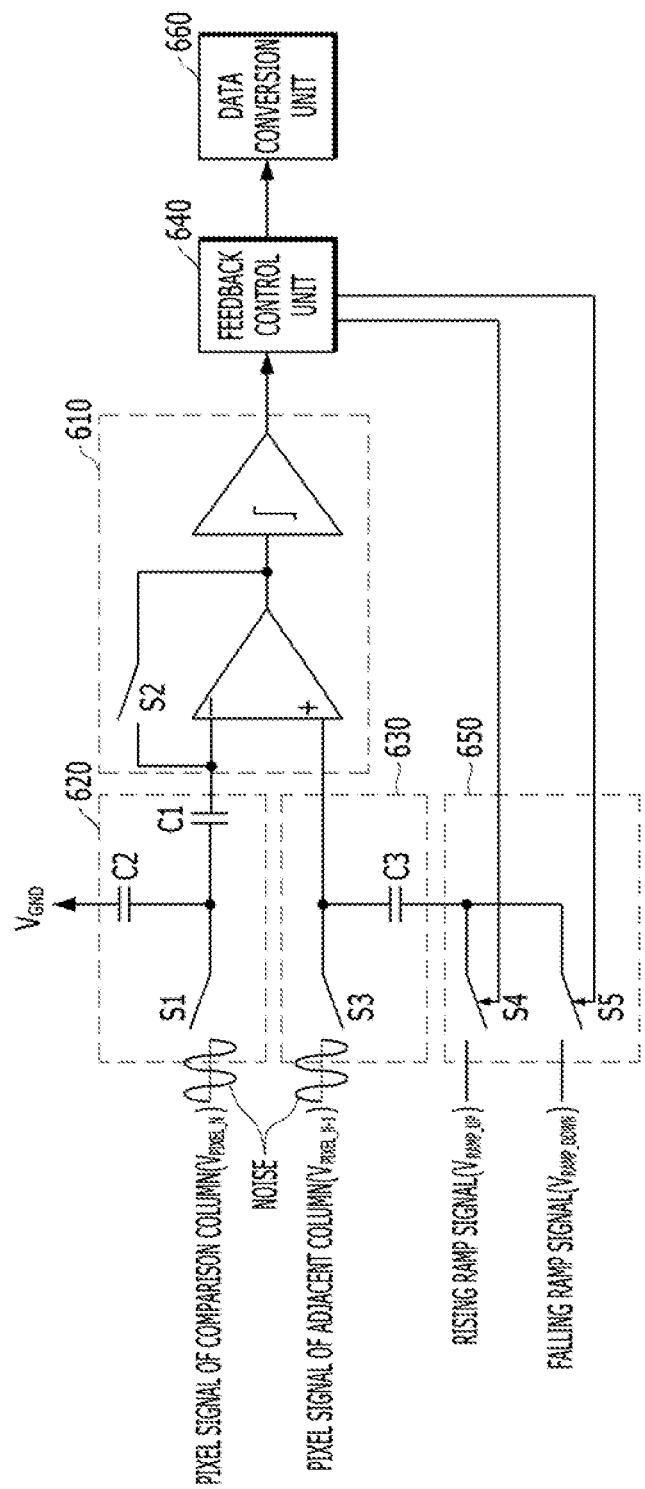
FIG. 6A is a diagram illustrating an analog-to-digital converter in accordance with an embodiment of the present invention.
Figure 6B:
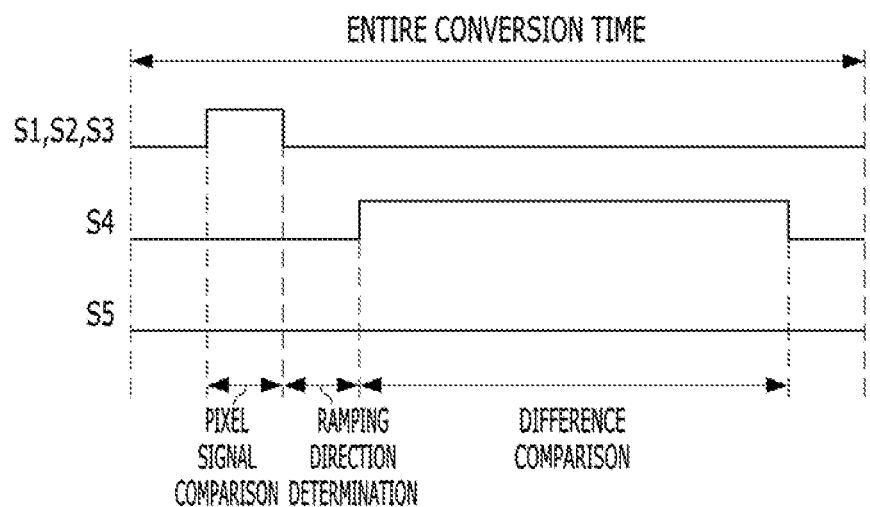
FIGS. 6B and 6C are diagrams describing control signal timings of the analog-to-digital converter shown in FIG. 6A.
Figure 6C:
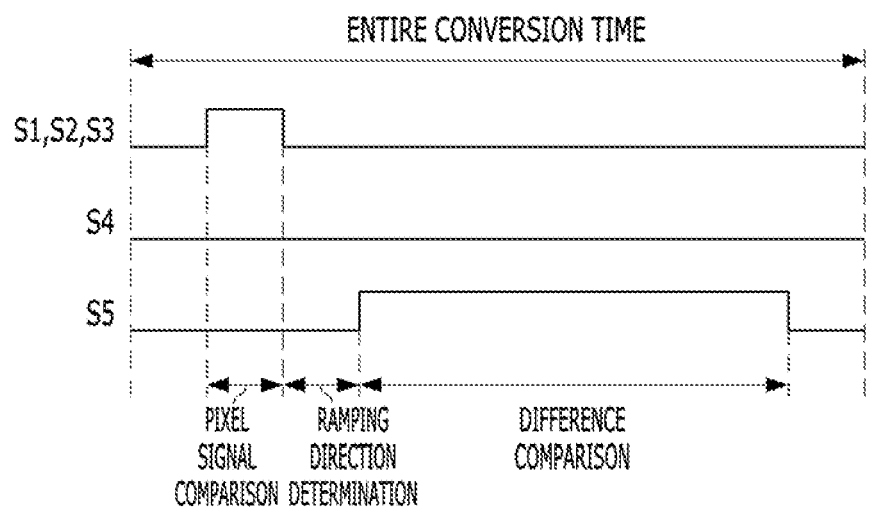
Figure 6D:
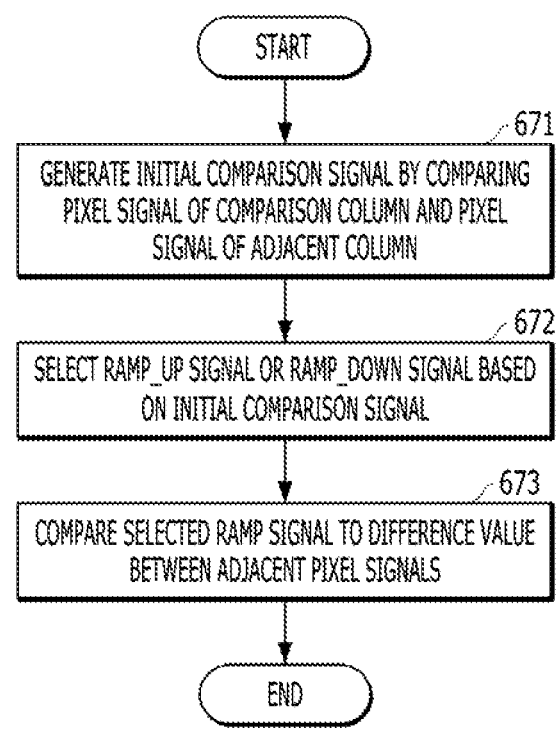
FIG. 6D is a flowchart describing an operating method of the analog-to-digital converter shown in FIG. 6A.

FIG. 6A is a diagram illustrating an analog-to-digital converter in accordance with an embodiment of the present invention, FIGS. 6B and 6C are diagrams for describing control signal timings of the analog-to-digital converter of FIG. 6A, and FIG. 6D is a flowchart for describing an operating method of the analog-to-digital converter of FIG. 6A.

FIG. 6A shows a configuration of an analog-to-digital converter which is positioned at the columns other than the reference column, FIG. 6B illustrates control signal timing when a value of a pixel signal of a comparison column is greater than a value of a pixel signal of an adjacent column, and FIG. 6C illustrates control signal timing when a value of the pixel signal of the comparison column is less than a value of the pixel signal of the adjacent column.

As illustrated in FIG. 6A, the analog-to-digital converter may include a comparison block 610, a CDS block 620, a sampling block 630, a feedback control unit 640, a selection block 650 and a data conversion unit 660. The comparison block 610 may compare a pixel signal $V_{PIXEL\_N}$ of a comparison column to a pixel signal $V_{PIXEL\_N-1}$ of an adjacent column at an initial stage, and compare any one signal selected between the ramp-up signal $V_{RAMP-UP}$ and the ramp-down signal $V_{RAMP-DOWN}$ to a difference value between adjacent pixel signals, that is, the pixel signal of the comparison column and the pixel signal of the adjacent column. The CDS block 620 may be coupled between a first input terminal receiving the pixel signal of the comparison column and a negative input terminal (−) of the comparison block 610, and perform CDS. The sampling block 630 may be coupled between a second input terminal receiving the pixel signal of the adjacent column and a positive input terminal (+) of the comparison block 610, and perform sampling. The feedback control unit 640 may determine a ramping direction according to the initial comparison signal from the comparison block 610, and output a control signal, that is, a fourth or fifth switch control signal for controlling a fourth or fifth switch. The selection block 650 may be coupled between the sampling block 630 and a third input terminal receiving the ramp-up signal and a fourth input terminal the ramp-down signal, and the sampling block 630, and select the ramp-up signal or the ramp-down signal according to the control signal from the feedback control unit 640. The data conversion unit 660 may perform data conversion according to the comparison signal of the comparison block 610.

The analog-to-digital converter may generate the initial comparison signal by comparing the pixel signal of the comparison column and the pixel signal of the adjacent column, determine the ramping direction according to the initial comparison signal so as to generate the control signal for selecting the ramp-up or ramp-down signal, and compare the selected ramp-up or ramp-down signal to the difference value between the adjacent pixel signals according to the control signal while performing a counting operation.

For example, the comparison block 610 may include an operational amplifier, a second switch S2 and a buffer or include the operational amplifier and the second switch S2. The CDS block 620 may include a first switch S1, a first capacitor C1 and a second capacitor C2 or include the first capacitor C1. The sampling block 630 may include a third switch S3 and a third capacitor C3. The selection block 650 may include the fourth switch S4 and the fifth switch S5.

The data conversion unit 660 may directly receive the comparison signal of the comparison block 610 or receive the comparison signal through the feedback control unit 640 as illustrated in FIG. 6A. The data conversion unit 460 may include a counter, and may further include a memory. When data conversion is completed, the corresponding block may be disabled to reduce standby power.

Referring to FIGS. 6A to 6D, the operation of the analog-to-digital converter will be described as follows.

The entire operation process of the analog-to-digital converter may be performed in order of a pixel signal comparison, a ramping direction determination, a difference comparison. A counting operation may be performed while the difference comparison is performed.

First, the analog-to-digital converter may generate the initial comparison signal by comparing a pixel signal of a comparison column to a pixel signal of an adjacent column, at step 671. That is, the analog-to-digital converter may receive the pixel signal of the comparison column and the pixel signal of the adjacent column at the initial stage, and generate the initial comparison signal by comparing the two signals. More specifically, the first to third switches S1 to S3 may be turned on, and the fourth and fifth switches S4 and S5 may be turned off. As the first switch S1 is turned on, the value of the pixel signal of the comparison column, inputted through the first input terminal, may be stored in the second capacitor C2. As the second switch S2 is turned on, the value of the pixel signal of the adjacent column, inputted through the second input terminal, may be stored in the third capacitor C3. Then, the comparison block 610 may compare the voltage levels of the pixel signal of the comparison column and the pixel signal of the adjacent column, and output the initial comparison signal to the feedback control unit 640.

Then, the analog-to-digital converter may determine the ramping direction according to the initial comparison signal and generate a control signal for selecting a ramp-up signal or ramp-down signal, at step 672. That is, when the comparison result between the pixel signal of the comparison column and the pixel signal of the adjacent column indicates that the pixel signal of the comparison column has a higher voltage level than the pixel signal of the adjacent column, the analog-to-digital converter may set the ramping direction to the upward direction to generate a control signal for selecting the rising ramping signal. When the comparison result indicates that the pixel signal of the comparison column has a lower voltage level than the pixel signal of the adjacent column, the analog-to-digital converter may set the ramping direction to the downward direction to generate a control signal for selecting the falling ramping signal. More specifically, the first to third switches S1 to S3 may be turned off. That is, when the comparison result between the pixel signal of the comparison column and the pixel signal of the adjacent column indicates that the pixel signal of the comparison column has a higher voltage level than the pixel signal of the adjacent column in a state where the first to fifth switches are turned off, the feedback control unit 640 may set the ramping direction to the upward direction to generate a control signal (i.e., the fourth switch control signal) for selecting the rising ramping signal. When the comparison result indicates that the pixel signal of the comparison column has a lower voltage level than the pixel signal of the adjacent column, the feedback control unit 640 may set the ramping direction to the downward direction to generate a control signal (i.e., the fifth switch control signal) for selecting the falling ramping signal.

Then, the analog-to-digital converter may compare the selected ramp-up or ramp-down signal to the difference value between the adjacent pixel signals, at step 673. That is, the analog-to-digital converter may select the ramp-up signal according to the control signal (i.e., the fourth switch control signal) for selecting the ramp-up signal, and compare the selected ramp signal to the difference value between the adjacent pixel signals, or select the ramp-down signal according to the control signal (i.e., the fifth switch control signal) for selecting the ramp-down signal, and compare the selected ramp signal to the difference value between the adjacent pixel signals. More specifically, when the fourth switch control signal for selecting the ramp-up signal, for example, a logic low signal is generated, the fourth switch S4 may be turned on to transfer the ramp-up signal to the sampling block 630 through the third input terminal. Then, the comparison block 610 may compare the difference value between the adjacent pixel signals to the ramp-up signal, and output a comparison signal. The data conversion unit 660 may perform data conversion in response to the comparison signal.

On the other hand, when the fifth switch control signal for selecting the ramp-down signal, for example, a logic high signal is generated, the fifth switch S5 may be turned on to transfer the ramp-down signal to the sampling block 630 through the fourth input terminal. Then, the comparison block 610 may compare the difference value between the adjacent pixel signals to the ramp-down signal, and output a comparison signal.

In accordance with the present embodiments of FIGS. 3 to 6D, a phase of a ramp signal with respect to a pixel signal may be determined by an initial comparison, and the determined pixel signal may be applied to a data conversion (i.e., a main comparison).

The analog-to-digital converter and the operating method thereof may effectively cancel pixel noise caused when a pixel signal is extracted, since the effect of the method may be determined by the Common Mode Rejection (CMR) characteristic of the comparison unit, and the distance between adjacent pixels is set to several micrometers (hm).

Furthermore, the analog-to-digital converter and the operating method thereof may shorten the data conversion time according to image data, thereby processing data at high speed. More specifically, when the range of a data code which is finally converted into a digital code is a maximum of 10 bits, the data code may be set to 1,024 codes. In the method shown in FIG. 1A, when the maximum code is 950 regardless of the form of image data, counting should be performed until the maximum code value is outputted. In the present embodiments, however, when it is assumed that the data codes of the entire pixels exist between 850 and 950 codes in case where the maximum code is 950, only 100 codes may be counted. Thus, the data conversion time may be shortened.

Furthermore, the analog-to-digital converter and the operating method may shorten the data conversion time, thereby minimizing standby power consumption. More specifically, when data conversion ends as described, the entire analog-to-digital blocks may be switched to the standby state, thereby reducing the standby power consumption.

Furthermore, the analog-to-digital converter and the operating method may lower the number of counting operations required for data conversion, thereby reducing counting power consumption. More specifically, in the method shown in FIG. 1A, when the average data code of the entire pixel signals is 900, 900 counting operations must be performed. In the present embodiments, however, counting operations may be performed by an actual difference value between adjacent pixel signals. This may be determined by the form of image data. In an extreme case, a data code difference value between adjacent pixels may be set to 1024. Such a case occurs at an evaluation step for evaluating the extreme operation characteristic, and a general natural image basically has continuity. Thus, the number of counting operations may be significantly reduced.

Although various embodiments have been described for illustrative purposes, it will be apparent to those skilled in the art that various changes and modifications may be made without departing from the spirit and scope of the invention as defined in the following claims.

What is claimed is:

1. An analog-to-digital converter comprising:
   a comparison circuit configured to compare a difference in value between adjacent first and second pixel signals with a ramp signal including a ramp-up signal and a ramp-down signal, the first pixel signal being a pixel signal of a comparison column and the second pixel signal being a pixel signal of an adjacent column to the comparison column;
   a correlated double sampling (CDS) circuit configured to perform CDS the CDS circuit being coupled between a first input terminal receiving the first pixel signal and a negative input terminal of the comparison circuit;
   a sampling circuit configured to perform sampling the sampling circuit being coupled between a second input terminal receiving the second pixel signal and a positive input terminal of the comparison circuit;
   a feedback control circuit configured to determine a ramping direction based on an initial comparison signal from the comparison circuit, and for outputting a control signal;
   a selection circuit coupled between the sampling circuit and a third input terminal receiving the ramp-up signal and a fourth input terminal receiving the ramp-down signal, and configured to select the ramp-up signal or the ramp-down signal based on the control signal; and
   a data conversion circuit configured to perform data conversion according to a comparison signal of the comparison circuit to a digital code data.

2. The analog-to-digital converter of claim 1, wherein the analog-to-digital converter generates the initial comparison signal by comparing the first pixel signal and the second pixel signal, determines the ramping direction based on the initial comparison signal to generate the control signal for selecting the ramp-up signal or ramp-down signal, and compares the ramp-up signal or the ramp-down signal selected according to the control signal to the difference value between the adjacent first and second pixel signals.

3. The analog-to-digital converter of claim 1, wherein when a value of the first pixel signal is greater than a value of the second pixel signal, the feedback control circuit sets the ramping direction to an upward direction and generates the control signal to select the ramp-up signal, and
   when a value of the first pixel signal is less than a value of the second pixel signal, the feedback control circuit sets the ramping direction to a downward direction and generates the control signal to select the ramp-down signal.

4. The analog-to-digital converter of claim 1, wherein the analog-to-digital converter selects the ramp-up signal according to the control signal to select the ramp-up signal and compares the selected ramp-up signal to the difference value between the adjacent first and second pixel signals, or selects the ramp-down signal according to the control signal to select the ramp-down signal and compares the selected ramp-down signal to the difference value between the adjacent first and second pixel signals.

5. An analog-to-digital converter comprising:
a comparison circuit configured to compare a pixel signal of a comparison column and a pixel signal of an adjacent column, and compare a ramp signal applied through a CDS circuit or a ramp signal applied through a sampling circuit to a difference value between adjacent pixels;
the CDS circuit coupled between a first input terminal receiving the first pixel signal and a negative input terminal of the comparison circuit, and configured to perform CDS;
the sampling circuit coupled between a second input terminal the second pixel signal and a positive input terminal of the comparison circuit, and configured to perform sampling;
a feedback control circuit configured to determine a ramp signal switching direction based on an initial comparison signal from the comparison circuit, and outputting a control signal;
a selection circuit coupled between a third input terminal receiving a ramp signal and the CDS circuit and the sampling circuit, and configured to select the ramp signal applied through the CDS circuit or the ramp signal applied through the sampling circuit based on the control signal from the feedback control circuit; and
a data conversion circuit configured to perform data conversion according to a comparison signal of the comparison circuit to a digital code data.

6. The analog-to-digital converter of claim 5, wherein the analog-to-digital converter generates the initial comparison signal by comparing the first pixel signal and the second pixel signal, determines the ramp signal switching direction based on the initial comparison signal to generate the control signal for selecting the ramp signal applied through the CDS circuit or the ramp signal applied through the sampling circuit, and compares the ramp signal applied through the CDS circuit or the ramp signal applied through the sampling circuit to the difference value between the adjacent first and second pixel signals, the ramp signal being selected according to the control signal.

7. The analog-to-digital converter of claim 5, wherein when a value of the first pixel signal is greater than a value of the second pixel signal, the feedback control circuit sets the ramp signal switching direction to the CDS circuit and generates the control signal to select the ramp signal applied through the CDS circuit, and
when a value of the first pixel signal is less than a value of the second pixel signal, the feedback control circuit sets the ramp signal switching direction to the sampling circuit, and generates the control signal to select the ramp signal applied through the sampling circuit.

8. The analog-to-digital converter of claim 5, wherein the analog-to-digital converter selects the ramp signal applied through the CDS circuit according to the control signal to select the ramp signal applied through the CDS circuit and compares the selected ramp signal to the difference value between the adjacent first and second pixel signals, or selects the ramp signal applied through the sampling circuit according to the control signal to select the ramp signal applied through the sampling circuit and compares the selected ramp signal to the difference value between the adjacent first and second pixel signals.

9. An analog-to-digital conversion method comprising:
generating an initial comparison signal by comparing a pixel signal of a comparison column to a pixel signal of an adjacent column;
generating a control signal for selecting a phase of a ramp signal with respect to the pixel signal based on the initial comparison signal; and
performing data conversion by comparing the selected ramp signal to a difference value between adjacent first and second pixel signals,
wherein the generating of the control signal comprises determining a ramping direction based on the initial comparison signal and generating a control signal for selecting a ramp-up signal or ramp-down signal.

10. The analog-to-digital conversion method of claim 9, wherein in the generating of the control signal,
when a value of the first pixel signal is greater than a value of the second pixel signal, the ramping direction is set to an upward direction to generate the control signal to select the ramp-up signal, and
when a value of the first pixel signal is less than a value of the second pixel signals, the ramping direction is set to a downward direction to generate the control signal to select the ramp-down signal.

11. An analog-to-digital conversion method comprising:
generating an initial comparison signal by comparing a pixel signal of a comparison column to a pixel signal of an adjacent column;
generating a control signal for selecting a phase of a ramp signal with respect to the pixel signal based on the initial comparison signal; and
performing data conversion by comparing the selected ramp signal to a difference value between adjacent first and second pixel signals
wherein the generating of the control signal comprises determining a ramp signal switching direction based on the initial comparison signal and generating the control signal for selecting the ramp signal switching direction through a CDS circuit or through a sampling circuit.

12. The analog-to-digital conversion method of claim 11, wherein in the generating of the control signal,
when a value of the first pixel signal is greater than a value of the second pixel signal, the ramp signal switching direction is set to the CDS circuit to generate the control signal to select the ramp signal applied through the CDS circuit, and
when a value of the first pixel signal is less than a value of the second pixel signal, the ramp signal switching direction is set to the sampling circuit to generate the control signal to select the ramp signal applied through the sampling circuit.

13. The analog-digital conversion method of claim 9, wherein the performing of data conversion comprises performing data conversion by comparing the rising or falling ramp signal selected according to the generated control signal to the difference between the adjacent pixel signals.

14. The analog-digital conversion method of claim 13, wherein the performing of data conversion comprises selecting the rising ramp signal according to the control signal for selecting the rising ramp signal and performing data conversion by comparing the selected rising ramp signal to the difference between the adjacent pixel signals, or selecting the falling ramp signal according to the control signal for selecting the falling ramp signal and performing data conversion by comparing the selected falling ramp signal to the difference between the adjacent pixel signals.

15. The analog-digital conversion method of claim 11, wherein the performing of data conversion comprises performing data conversion by comparing the ramp signal applied to the CDS circuit or the ramp signal applied to the sampling circuit to the difference between adjacent pixel signals, the ramp signal being selected according to the generated control signal.

16. The analog-digital conversion method of claim 15, wherein the performing of data conversion comprises selecting the ramp signal applied to the CDS circuit according to the control signal for selecting the ramp signal applied to the CDS circuit and performing data conversion by comparing the selected ramp signal to the difference between the adjacent pixel signals, or selecting the ramp signal applied to the sampling circuit according to the control signal for selecting the ramp signal applied to the sampling circuit or performing data conversion by comparing the selected ramp signal to the difference between the adjacent pixel signals.

* * * * *